United States Patent [19]
Kanamori

[11] Patent Number: 5,838,611
[45] Date of Patent: Nov. 17, 1998

[54] NONVOLATILE SEMICONDUCTOR DEVICE AND METHOD OF MANUFACTURING SAME

[75] Inventor: Kohji Kanamori, Tokyo, Japan

[73] Assignee: NEC Corporation, Tokyo, Japan

[21] Appl. No.: 911,002

[22] Filed: Aug. 14, 1997

[30] Foreign Application Priority Data

Aug. 15, 1996 [JP] Japan .................................... 8-215634

[51] Int. Cl.$^6$ .................................................. G11C 11/34
[52] U.S. Cl. ........................... 365/174; 365/104; 437/43; 357/23.5
[58] Field of Search .............................. 365/104, 185.11, 365/185.29, 63; 437/43; 357/23.5

[56] References Cited

U.S. PATENT DOCUMENTS

| 5,615,152 | 3/1997 | Bergemont | 365/185.29 |
| 5,638,327 | 6/1997 | Dallabora et al. | 365/104 |
| 5,666,304 | 9/1997 | Hikawa et al. | 365/104 |
| 5,717,636 | 2/1998 | Dallabora et al. | 365/185.11 |

OTHER PUBLICATIONS by M. Ohi et al., "An Asymmetrical Offset Source/Drain Structure for Virtual Ground Array Flash Memory with DINOR Operation", *1993 Symposium on VLSI Technology*, The Japan Society of Applied Physics, the IEEE Electron Devices Society, May 1993, pp. 57 and 58.

by J. Esquivel et al., "High Density Contactless, Self Aligned Eprom Cell Array Technology", *IEDM Technical Digest*, Dec. 1986, pp. 592–595.

*Primary Examiner*—David Nelms
*Assistant Examiner*—Thong Le
*Attorney, Agent, or Firm*—Young & Thompson

[57] ABSTRACT

A semiconductor memory device with a contactless array structure has bit-lines formed in a semiconductor substrate by diffusion of an impurity. Word-lines (control gates) are formed on the substrate so as to intersect the bit-lines. Floating gates are disposed in intersecting regions between the bit- and word-lines. Regions of higher resistance extend in parallel to the bit-lines located on both sides of a floating gates and located in an offset manner relative to the floating gate. A thick dielectric film is formed between the regions of higher resistance and word-lines. In this semiconductor memory device, a source side injection method with higher efficiency can be utilized for electron injection to a floating gate (programming) and thereby a lower programming voltage, less power consumption, and higher degree of integration are achieved.

8 Claims, 20 Drawing Sheets

D3-D3

C3-C3

C3-C3

NONVOLATILE SEMICONDUCTOR DEVICE AND METHOD OF MANUFACTURING SAME

BACKGROUND OF THE INVENTION

1. Field of the Invention

The present invention relates to a semiconductor memory device, and more particularly, to a structure of a non-volatile semiconductor device and a method of manufacturing the same.

2. Description of the Related Art

A technique called contactless array in a semiconductor memory device has heretofore been used for higher integration of the semiconductor memory device, as described, for example, in an article entitled "HIGH DENSITY CONTACTLESS, SELF ALIGNED EPROM CELL ARRAY TECHNOLOGY" in IEDM TECHNICAL DIGEST, pp. 592–595, December, 1986. FIG. 1 shows a plan view illustrating an embodiment of a contactless array, FIGS. 2A and 2B are respective sectional views taken on lines A4—A4 and B4—B4 of FIG. 1. Bit-lines 202, each of which is a diffused layer formed in a silicon substrate 201, is respectively arranged perpendicular to word-lines 208, each of which works as a control gate formed in an upper layer above the substrate 201. The array is called contactless array, for no contacts for bit-lines and word-lines are present in it. A dielectric film 203 which is formed by oxidation of the diffused layer is inserted between a bit-line 202 and a word-line 208 for isolation. Moreover, a channel for a memory cell is present between adjoining two bit-lines. A floating gate 205 is rested on a gate dielectric film 204 in such a configuration that the gate 205 overlaps a channel and bit-lines and is isolated from the word-line 208 by a dielectric film 207. Device isolation is secured by a space between word lines. Accordingly, a structure of a memory cell is simpler and higher integration becomes actual possibility by adopting a contactless structure.

A manufacturing process of such a memory cell array will be described in reference to FIGS. 3A, 3B and 3C, wherein the figures show respective sectional views in successive steps of the same portion as that of FIG. 2A. As shown in FIG. 3A, source and drain regions 202, which work as bit-lines, are formed in the silicon substrate 201 by an ion implantation technique. Next, as shown in FIG. 3B, the gate oxide film 204 is formed by a thermal oxidation method. In this step, source/drain regions are provided with thicker oxide layers 203 than the gate oxide film by accelerated oxidation due to impurities. Then, as shown in FIG. 3C, floating gates 205 are formed in a desired pattern, subsequently an interlayer dielectric film 207 for isolation of control gates, as shown in FIG. 2A, and word-lines 208 as control gates are, in that order, formed, which is not shown in the figure, to finally complete memory cells.

In recent non-volatile semiconductor devices, devices having an offset structure with higher resistance in order to attain lower programming voltage and less power consumption have been proposed. For example, one of the devices was disclosed in Japanese patent application No. H5-273263, which was proposed by the same inventors as the present invention's. This device has, as shown in FIG. 4, a structure in which a source 303 and a drain 304 are formed on a silicon substrate 301, a dielectric film 305, a floating gate 306 and an interlayer film 307 and a control gate 308 are, in that order, formed on a channel present between the source 303 and drain 304 and they are all covered by a dielectric film 309. An offset region 310 is formed between the source 303 and the channel, which region is consisting of a p-diffusion layer 310, which is doped with boron. The offset region has a higher resistance, as compared with that of the channel, and almost all of the voltage applied between the source 303 and the drain 304 is, thereby, concentrated in the offset region 310. Such concentration of the applied voltage enables hot electrons to be generated with higher efficiency in the offset region 310, which makes it possible to effect hot electron injection at a lower voltage and current, that is, with less power consumption.

A process of manufacturing a non-volatile semiconductor device with such an offset structure will be described referring to FIGS. 5A, 5B and 5C. As shown in FIG. 5A, a stacked gate structure composed of, upwardly arranged in the following order, a dielectric film 305, a floating gate 306, an interlayer film 307 and a control gate 308 is formed on a silicon substrate 301, then boron is ion-implanted only in the source region to create a P-type diffused layer region 302. Thereafter, as shown in FIG. 5B, polysilicon is deposited all over the surfaces of the stacked gate to form a silicon layer and the silicon layer is subjected to anisotropic etching to leave side walls 311 and 312. As shown in FIG. 5C, the polysilicon side wall 312, which is above the drain region, is removed, while the side wall 311 above the source region is covered with a mask. Subsequently, the stacked gate structure and the polysilicon side wall 311 above the source region are masked and in such circumstances, arsenic is ion-planted in self-alignment to create diffused layers of a source 303 and a drain 304. In a final step, as shown in FIG. 4, the polysilicon side wall 311 above the source region is removed. It might be considered that the offset structure shown in FIG. 4 is applied to the contactless array which seeks higher integration to reduce voltage and power consumption. However, such application is difficult to be put into practical use, since it is difficult to selectively create an offset region with higher resistance between a source region and a channel in the contactless array structure. In more detail, in a non-volatile semiconductor device with an offset structure doped with boron, an offset region is created after word-lines are formed. On the other hand, in a contactless array structure, control gates (word-lines) and sources/drains (bit-lines) intersect perpendicularly to each other and, after the word-lines are formed, boron cannot be doped under the word-lines. Even if a structure of a nonvolatile semiconductor memory device having an offset structure therein was simply introduced into a contactless array structure, a control gate is positioned above a boron doped region and thereby the offset structure is not realized, since a control gate (a word line) and a source and a drain (bit-lines) intersect each other.

SUMMARY OF THE INVENTION

It is an object of the present invention to provide a non-volatile semiconductor device having an offset structure with higher resistance, which has a contactless array capable of higher integration, and makes it possible to effect hot carrier injection by source side injection with higher efficiency, and a method of manufacturing the same.

The present invention has a feature that, in a semiconductor memory device with a contactless array structure, bit-lines located in both sides of a floating gate have regions of higher resistance being offset relative to the floating gates. Especially, an offset region with higher resistance overlaps a word-line, and the offset region and the word-line are electrically separated by a thick dielectric film. In addition, it is preferred in the present invention that erase electrodes are respectively inserted between every second and third word-lines. It is further preferred in the present invention that a LOCOS dielectric film or a trench isolation film, which is formed by making a trench into a semiconductor substrate and the trench is then filled with a dielectric film, is formed between adjoining floating gates.

A method of manufacturing of the present invention comprises the following steps of: forming a gate dielectric film on a semiconductor substrate of a first conductivity type; forming an electrode for forming a floating gate on the gate dielectric film; effecting first ion-plantation of an impurity of the first conductivity type to the substrate at an angle inclined relative to the surface thereof in such a manner that a region on one side of the electrode may be shadowed by the same electrode, but an region on the other side thereof may not be shadowed thereby; forming side walls of a dielectric film on the sides of the electrode; effecting second ion-plantation of a second conductivity impurity to the substrate in a direction normal to the surface thereof or at an angle relative to the surface thereof inclined in a direction opposed to the direction of the first ion-plantation to form bit-lines; burying spaces between the electrodes with a dielectric film; and forming word-lines so as to intersect respective bit-lines.

According to a non-volatile semiconductor device having an offset region with higher resistance of the present invention, a lower programming voltage and less power consumption are, at the same time, realized in a contactless memory array which is capable of higher integration. The reason why is because source side injection of higher efficiency can be actually performed. In addition, according to a non-volatile semiconductor device having an offset region with higher resistance of the present invention, it is made possible to manufacture a contactless memory array with a higher degree of integration. The reason why is because, when source side injection is used in a program operation and on the other hand an erase electrode is adopted in an erase operation, a higher working voltage to be applied to a diffused layer in a memory cell array is not necessary and a shallow diffused layer can, thereby, be employed, which makes it possible to increase a degree of integration more.

DESCRIPTION OF THE PREFERRED EMBODIMENTS

Now, preferred embodiments of the present invention will be described in reference to the accompanying drawings in detail.

Figure 1:
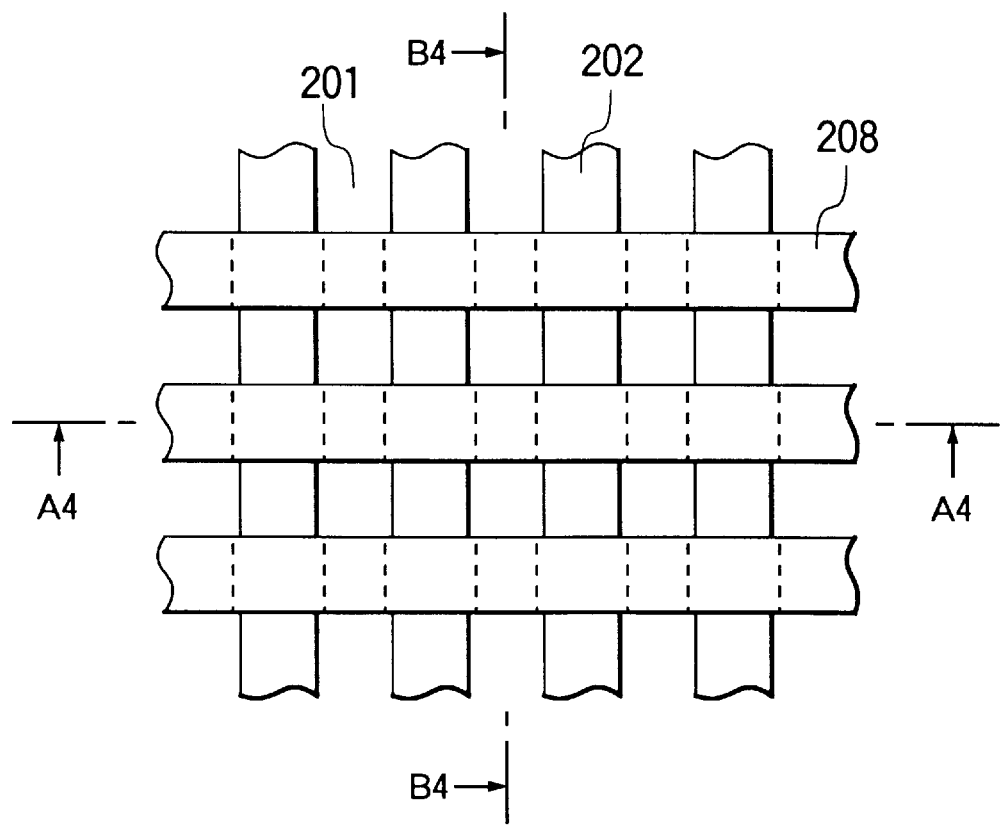
FIG. 1 is a plan view of a conventional a semiconductor memory device of a contactless array structure.
Figure 2A:
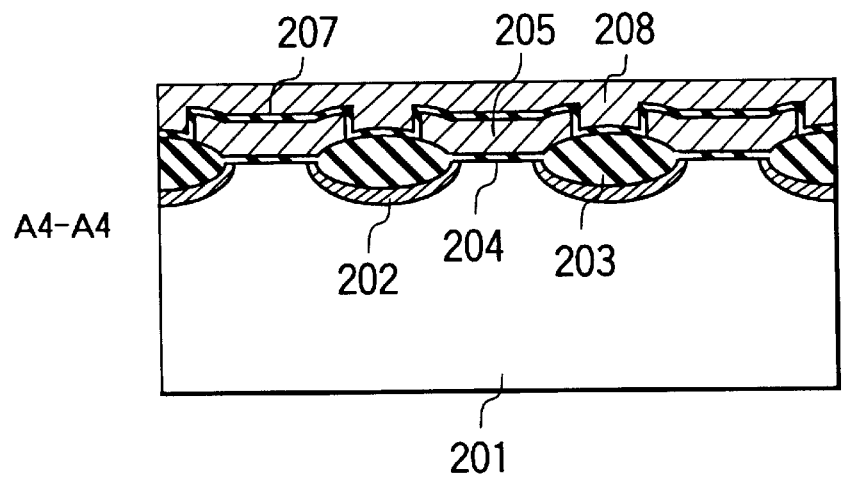
FIGS. 2A and 2B are respective sectional views of FIG. 1 taken on lines A4—A4 and B4—B4.
Figure 2B:
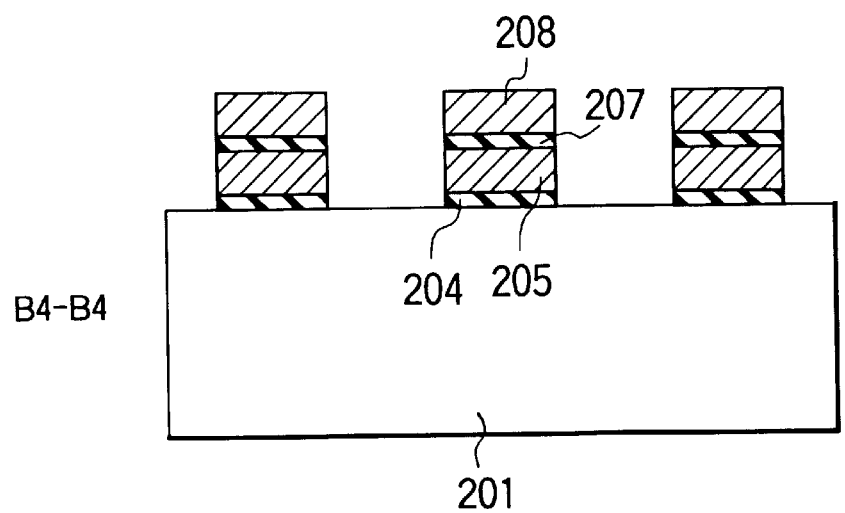
Figure 3A:
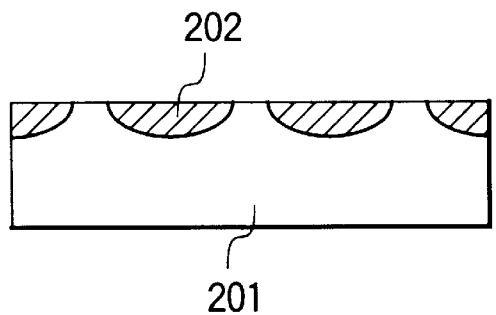
FIGS. 3A to 3C are respective sectional views illustrating a method of manufacturing the semiconductor memory device of FIGS. 1, 2A and 2B in the processing order thereof.
Figure 3B:
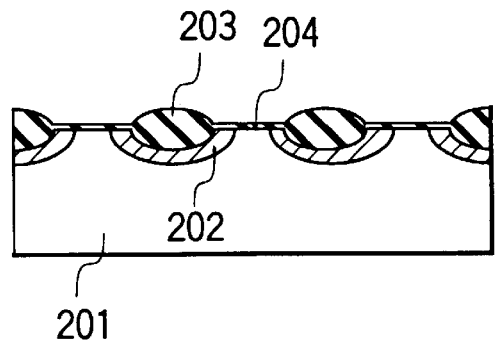
Figure 3C:
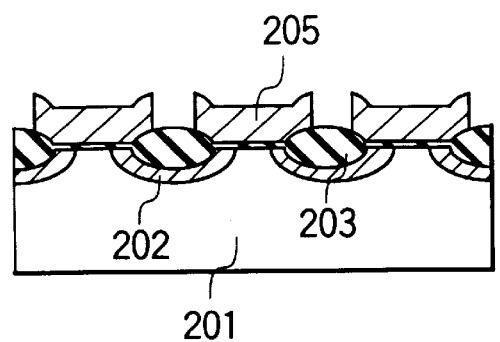
Figure 4:
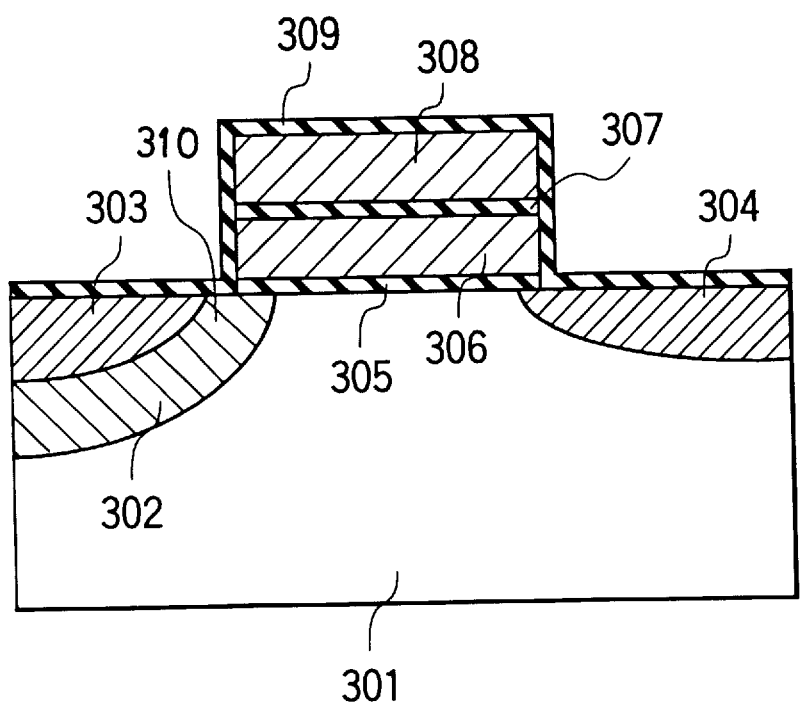
FIG. 4 is a sectional view of an example of another conventional semiconductor memory device.
Figure 5A:
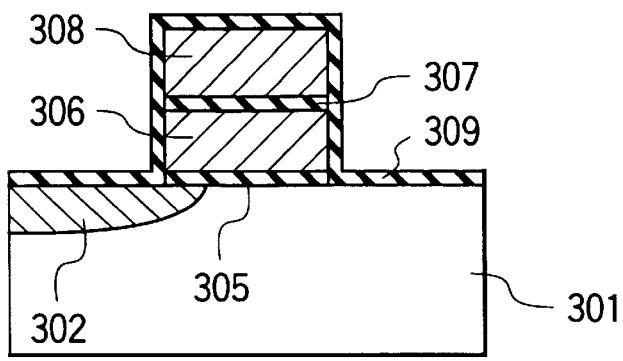
FIGS. 5A to 5C are sectional views illustrating a method of the semiconductor memory device of FIG. 4 in the processing order thereof.
Figure 5B:
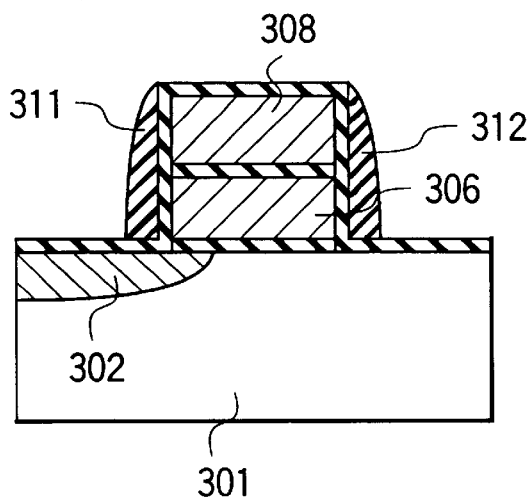
Figure 5C:
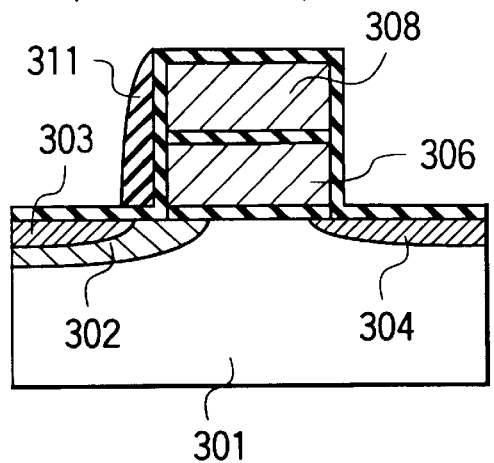
Figure 6:
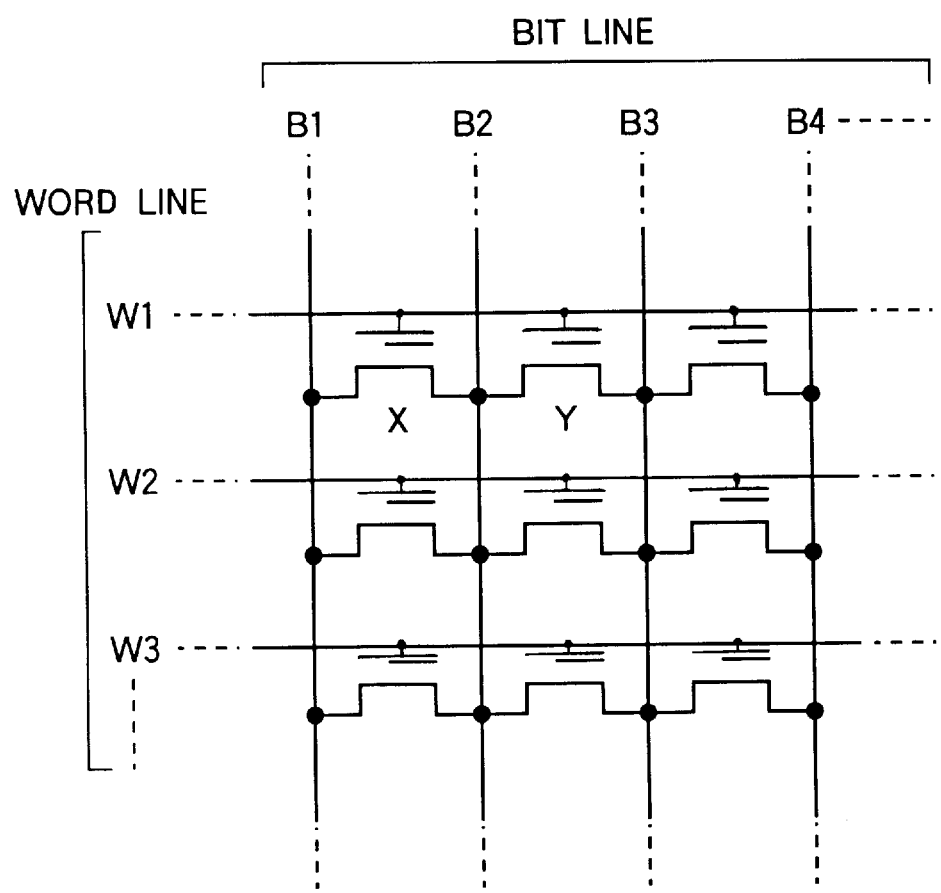
FIG. 6 is a circuit diagram showing a first embodiment of the present invention.

FIG. 6 is a circuit diagram showing a memory cell array of a first embodiment of the present invention. In the memory cell array, each of bit-lines B1 to B4 - - - intersects word-lines W1 to W3 - - - , memory cells have respective floating gates and the word-lines W1 to W3 work as respective control gates. In addition, the bit-lines B1 to B4 work as a source and a drain alternatively. In other words, in a memory cell X, the bit-line B1 is a source, the bit-line B2 is a drain, and in a memory cell Y, the bit-line B2, at this time, is a source and the bit-line B3 is a drain.

Figure 7A:
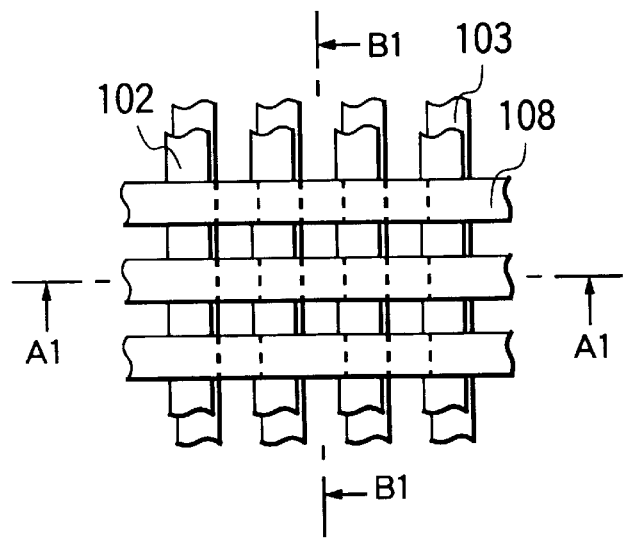
FIG. 7A is a plan view of an semiconductor memory device of the first embodiment.
Figure 7B:
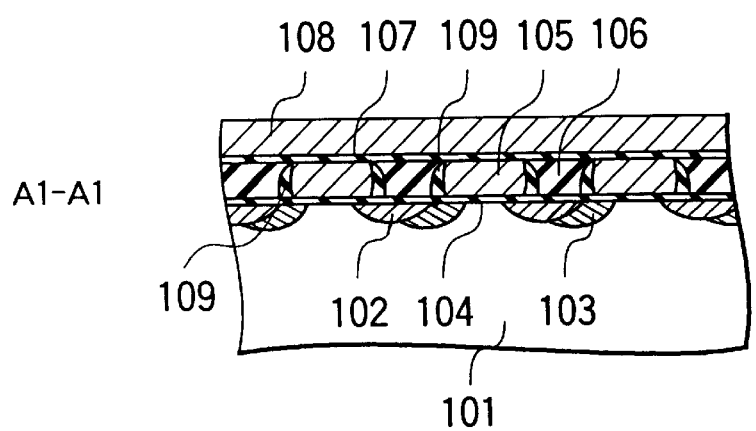
FIGS. 7B and 7C are respective sectional views of FIG. 7A taken along lines A1—A1 and B1—B1.
Figure 7C:
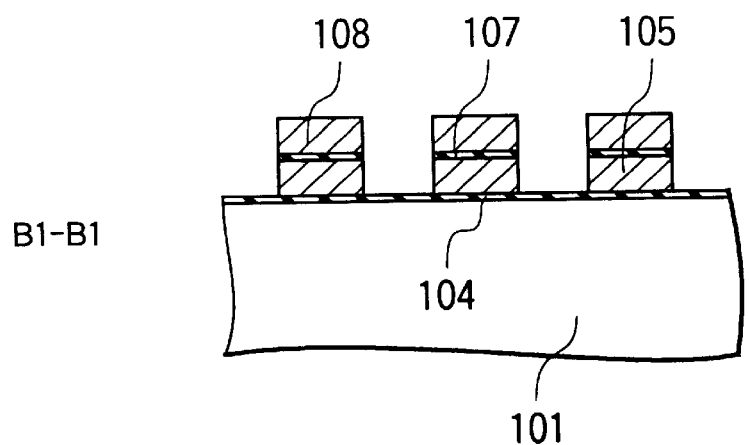

FIG. 7A is a plan view of a memory cell of the embodiment and FIGS. 7B and 7C are respective sectional views of FIG. 7A taken along lines A1—A1 and B1—B1. A plurality of first diffused layers 102 doped with an N-type impurity each as a bit-line are, in parallel with one another, created in a P-type silicon substrate 101 and a plurality of control gates 108 each as a word-line are, in parallel with one another, formed along directions perpendicular to the first diffused layers 102. A second diffused layer 103 having a higher concentration of a P-type impurity than that of the P-type silicon substrate 101 is created on one side of each of the second diffused layers 102. The second diffused layer 103 is necessarily located on the same side of the first diffused layer 102 adjoined thereby when the figure is seen on the sheet. A floating gate 105, which serves for accumulating electrons, is formed on the surface of the silicon substrate 101 with a gate dielectric film 104 therebetween. At this time, oxide side walls 109 are formed on both sides of the floating gate 105 and the lower end of one oxide side wall does not overlap the first diffused layer 102 but the lower end of the other oxide side wall overlaps another first diffused layer 102. That is, one end of the floating gate 105 is necessarily offset relative to the first diffused layer 102 and the second diffused layer 103 is created in this offset region. A space between adjoining two floating gates is filled with a dielectric film 106 at least thicker than that of the gate oxide film 104 and an interlayer film 107 electrically isolates the floating gates 105 from control gates 108. Moreover, electrical isolation between the first diffused layer 102 or the second diffused layer 103 and the control gate 108 is effected by the dielectric film 106 and the interlayer film 107.

Operations of a contactless array of this structure will be described. First of all, electron injection into a floating gate (program operation) will be described. For example, when programming is effected to the memory cell X, a positive voltage is applied to word line W1, bit-line B1 (source) is grounded and a positive voltage is applied to bit-line B2 (drain). All the word-lines other than word-line W1 are grounded. Under such circumstances, a current flows between a source and a drain by the positive voltage applied to the control gate electrode. In this case, an offset region has a sufficiently larger resistance, as compared with that of the channel, since the dielectric film 106 between the control gate 108 and the first diffused layer 102 or the second diffused layer 103 is thick and a concentration of P-type impurity of the second diffused layer 103 in an offset region is higher than that of the P-type silicon substrate 101. As a result, almost all of the voltage applied between source and drain is developed in the offset region 103 and an electric field strength in the offset region becomes high, which generates hot electrons with higher efficiency in the vicinity of the offset region and thereby electrons are injected into the floating gate 105. A threshold voltage of a memory cell becomes higher by injected electrons to the floating gate 105. The state of the higher threshold voltage is designated as a program state. The program operation may be effected for each bit or for a group of bits which are dispersed in a scattered manner over the array.

Next, release of electrons from a floating gate (erase operation) will be described. For example, when erasing is effected in the memory cell X of FIG. 6, a voltage of "zero" or minus is applied to word-line W1 and a positive voltage is applied to bit-line B2. At this time, a. potential difference between a word- and bit-lines is set at such a value that a F-N tunnel current may flow. As a result, electrons are released to the bit-line B2 from the floating gate by the F-N current to reduce a threshold voltage of the memory cell. The erase operation may be effected for each bit or for a group of bits which are dispersed in a scattered manner over the array.

Next, a read operation, in which it is judged whether a memory cell is in a write state or erase state, will be described. For example, when reading is effected in the memory cell X, a positive voltage is applied to word-line W1 (control gate), bit-line B2 is grounded and a positive voltage is applied to bit-line B1 (drain). At this time, the positive voltages applied to word- and bit-lines (drain) are lower than that applied when programming is effected and the other word-lines than the word-line W1 are grounded. In addition, it is important that a role of bit-line is a reverse of that in a program state. With the reverse in role, the voltage of the bit-line B1 is applied to in an offset region and a potential of electrons is thereby lowered in the offset region. That is, strength of the electric field in the offset region is alleviated and thereby, generation of hot electrons is suppressed to enable reading in a stable manner, wherein reading is an operation to judge whether a memory cell is in a program state or erase state based on the phenomena that, when the memory cell is in the erase state, a current flows between bit-lines and, when it is in the program state, no current flows between the bit-lines.

As described above, in such a structure of a contactless array, the control gate 108 and the offset region 103 are isolated from each other with a sufficiently thick dielectric film 106 lying therebetween and a resistance of the offset region 103 is designed to be sufficiently higher than a resistance of a channel under the floating gate 105, though the control gate 108 and the offset region 103 are overlapped by each other. Accordingly, when writing is effected in the contactless array, hot carrier injection by means of a source side injection method with higher efficiency can be realized and lower working voltage, less power consumption and higher degree of integration become all practicable at the same time.

Figure 8A:
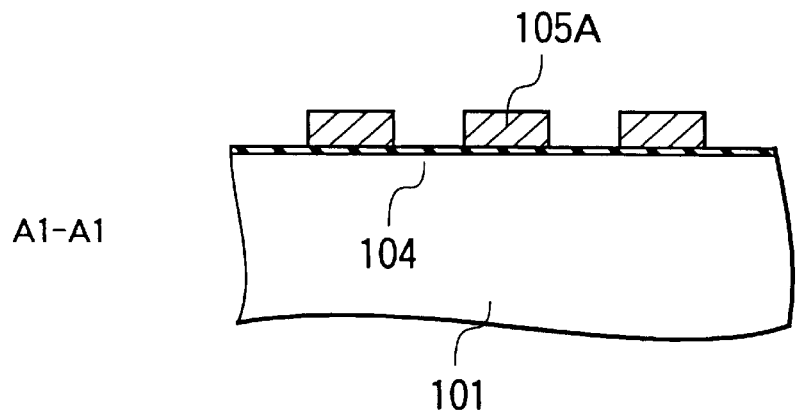
FIGS. 8A to 8F are respective sectional views illustrating a method of a semiconductor memory device of the first embodiment of the present invention.

An example of a method of manufacturing the contactless array of FIG. 6 will be described in reference to FIGS. 8A to 8F. These FIGS. 8A to 8F are respective sectional views relating to the semiconductor memory device depicted in FIG. 7B. As shown in FIG. 8A, a gate oxide film 104 is, first of all, formed on a P-type semiconductor silicon substrate 101 by a thermal oxidation or a CVD method and non-doped polysilicon or N-type polysilicon 105A is further piled up on the gate oxide film 104. When the non-doped polysilicon is piled up by the CVD method, the non-doped polysilicon is doped with a N-type impurity by means of a thermal diffusion or an ion implantation method. The polysilicon 105A is then processed in linear pattern.

Figure 8B:
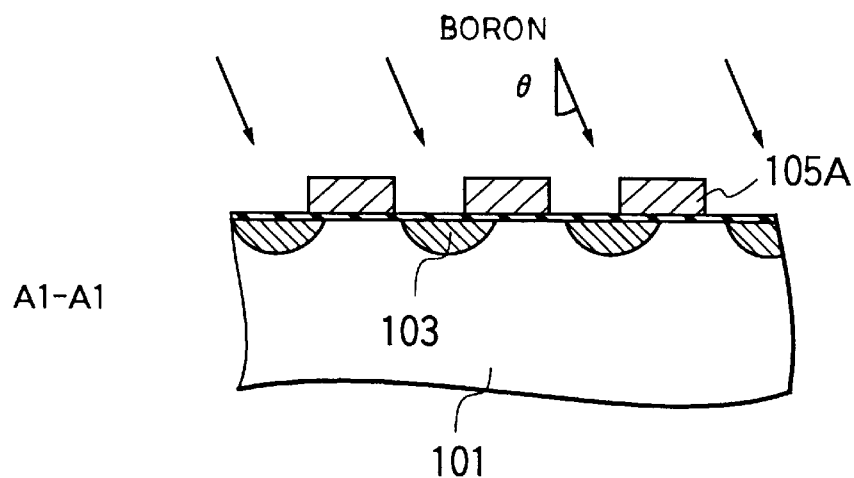

Such a patterned substrate is subjected to oblique ion implantation, as shown in FIG. 8B, with a P-type impurity, for example boron, at an angle θ (0°<θ<90°) from a normal line to the surface 101 to create the P-type diffused layer 103. In this situation, the polysilicon 105A overlaps the P-type diffused layer 103 at one end of the polysilicon 105A and a region which is not ion-implanted due to a shadowing effect of the polysilicon 105A is left at the other end thereof in the substrate 101.

Figure 8C:
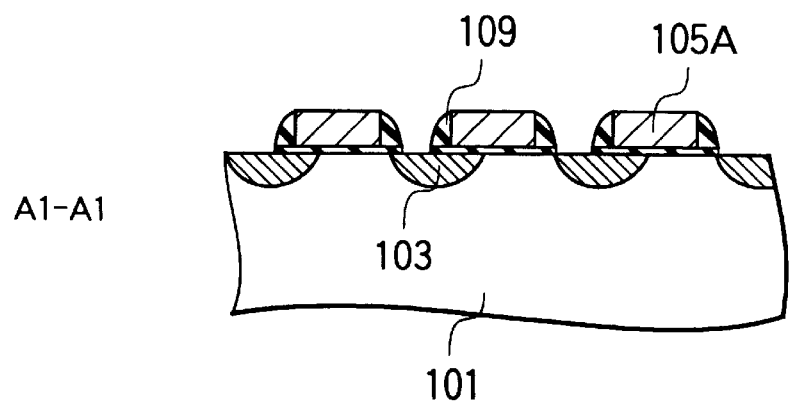

An oxide film is then piled up on the ion implanted substrate 101 by means of the CVD method, as shown in FIG. 8C, and the oxide film is etched back to leave oxide film side walls 109.

Figure 8D:
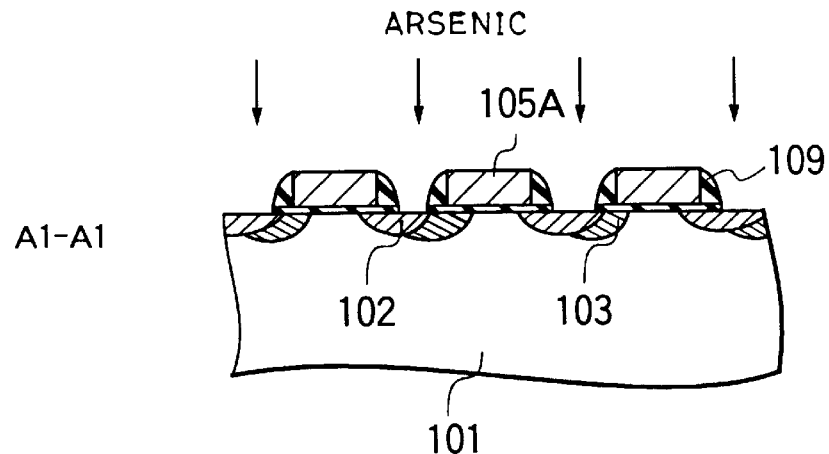

Next, as shown in FIG. 8D, ion implantation with an N-type impurity, for example, arsenic, is performed to create an N-type diffused layer 102 in the substrate 101, wherein a direction of the ion implantation is normal to the surface of the substrate 101 or inclined from the normal line to the substrate 101 in a reversed manner of when boron ion implantation is performed to create a P-type diffused layer 103. In this situation, an offset occurs in an area between an N-type diffused layer 102 and one end of the polysilicon 105A which overlaps a boron diffused layer, since a concentration of boron is sufficiently higher at the one end of the polysilicon 105A. At the other end of polysilicon 105A, the N-type diffused layer 102 overlaps polysilicon 105A by diffusion of arsenic, since boron has not been ion implanted there.

Figure 8E:
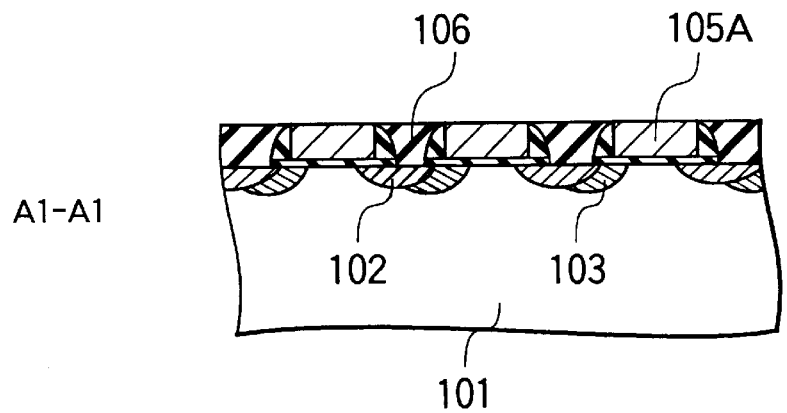

As shown in FIG. 8E, a dielectric film, for example, an oxide film, is piled up on the arsenic ion implanted substrate by means of the CVD method and then the substrate 101 is etched back to form a buried oxide film 106 in spaces between floating gates, wherein the upper surface of polysilicon 105A is fully exposed.

Figure 8F:
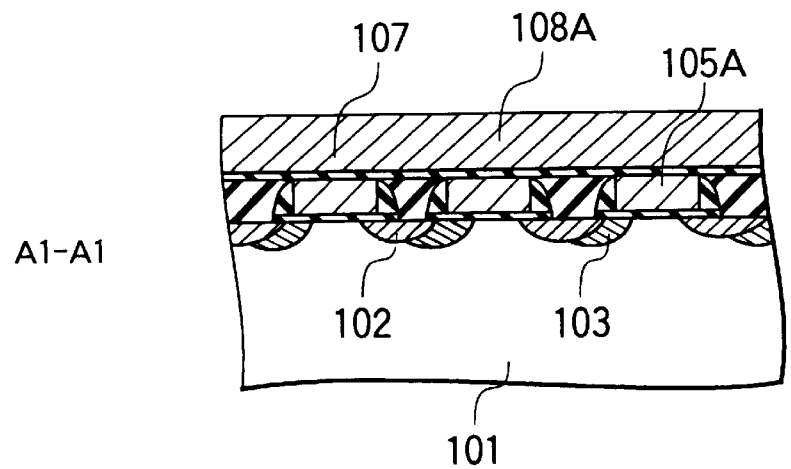

As shown in FIG. 8F, the substrate 101 is thereafter subjected to formation thereon of a further dielectric film, for example oxide layer or a layered film 107 composed of oxide and nitride films and further formation of polysilicon or polycide 108A thereon is subsequently performed. The polysilicon or polycide 108A is then patterned to form control gates 108. At the same time as the patterning, the oxide film or layered film including a nitride film in areas where patterns of control gates are not present and polysilicon 105A are etched to form floating gates 105 in a isolated condition.

Figure 9:
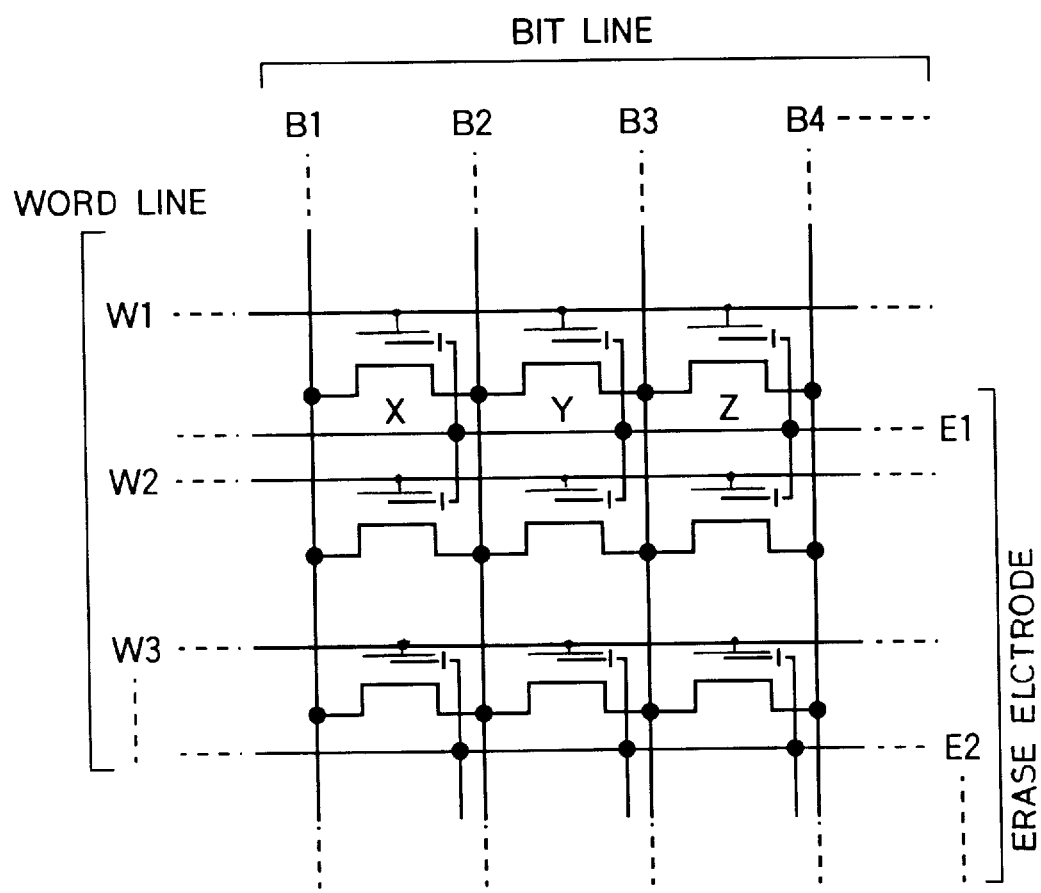
FIG. 9 is a circuit diagram showing a second embodiment of the present invention.

A second embodiment of the present invention will described in reference to the accompanying drawings here. FIG. 9 is a circuit diagram showing a contactless array relating to the second embodiment of the present invention. This embodiment is different from the structure of the first embodiment in that the second embodiment further includes erase electrodes E1 and E2.

Figure 10A:
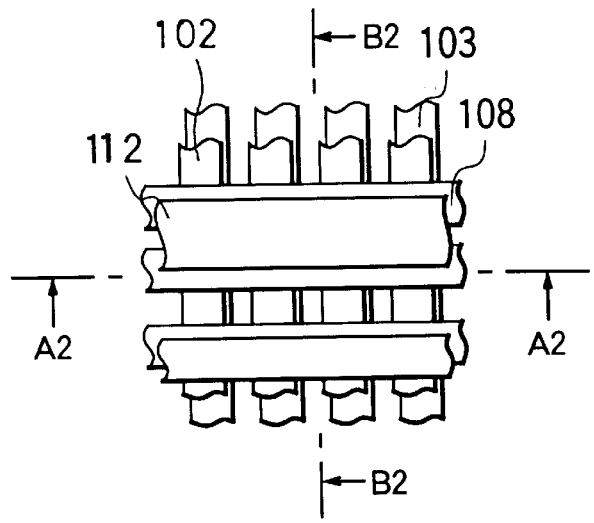
FIG. 10A is a plan view of a semiconductor memory device of the second embodiment of the present invention.
Figure 10B:
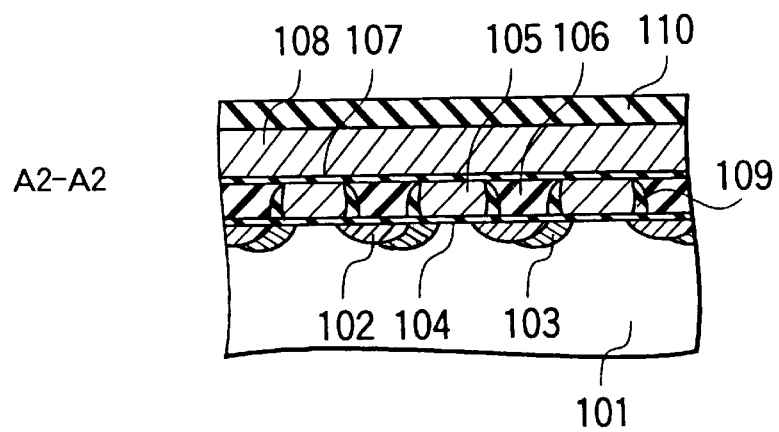
FIGS. 10B and 10C are respective sectional views of FIG. 10A taken on lines A2—A2 and B2—B2.
Figure 10C:
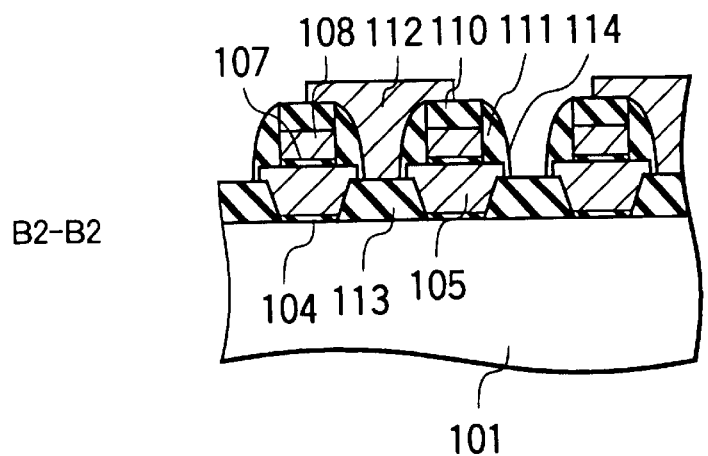

FIG. 10A is a plan view of the second embodiment and FIGS. 10B and 10C are respective sectional views taken on lines A2—A2 and B2—B2 of FIG. 10A. In the second embodiment, parts having similar functions to those of the first embodiment are labeled with the same marks as those of the first embodiment and detailed descriptions will be omitted. In the structure of the second embodiment, floating gates 105 are isolated with a thick dielectric film 113, a height region including a control gate 108 and a floating gate 105 is covered with a formed tunnel gate oxide film 114 and erase electrodes 112 are formed between every second control gate 108 and every third control gate 108 along a direction of arranging control gates 108. In this condition, a memory cell array contacting with one the erase electrodes 112 is a minimum erase block, wherein one erase electrode for each erase block is at least required to be formed so as to contact with all the floating gates of memory cells within the erase block.

Erase operation in the case where an erase electrode is used will be described. For example, when erasing is effected with respect to memory cells X, Y and Z, a substrate or wells, and bit-lines and word-lines are grounded, a positive voltage is applied to erase electrode E1 only. At this time, a voltage applied to the erase electrode 112 is set at a value at which a F-N current may flow between the erase electrode and the floating gate. As a result, electrons are released from the floating gate 105 to the erase electrode 112 under application of the voltage by the F-N current and erase operation is thus effected. Therefore, in an erase operation, a voltage is only required to be applied to the erase gate electrode 112. The second embodiment is different from the first embodiment in that, when erasing is effected, a diffused layer does not require application thereto of a voltage in order to make a F-N current flow and thereby a leak current from the diffused layer to a substrate can be avoided. Moreover, a withstand voltage in the diffused layer can be designed in consideration of program and read operations only and accordingly, the withstand voltage can be set at a lower value.

Figure 11A:
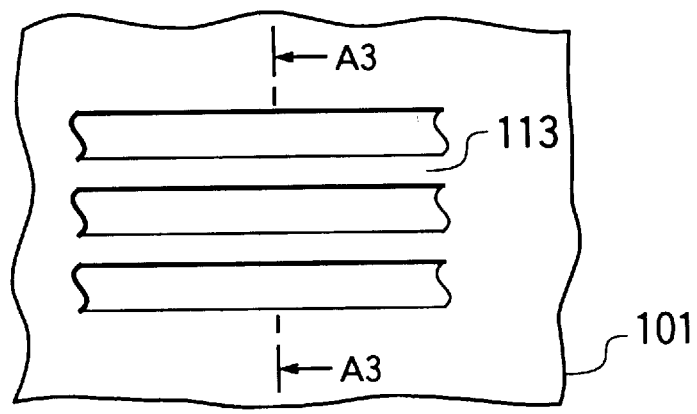
FIG. 11A is a view a plane view illustrating a first step of a method of a semiconductor memory device of the second embodiment of the present invention.
Figure 11B:
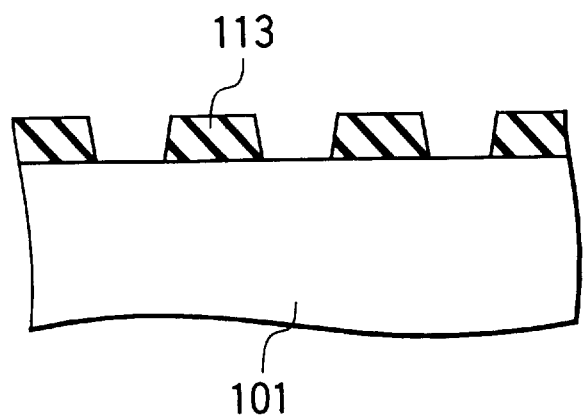
FIG. 11B is a sectional view of FIG. 11A taken on line A3—A3.

An Example of a method of manufacturing according to the second embodiment will be in detail described. As shown in the planar pattern of FIG. 11A, the oxide film 113 with a pattern, which is used for isolation, is formed on the P-type semiconductor silicon substrate 101 by means of a thermal oxidation or a CVD method. FIG. 11B is a sectional view taken on line A3—A3 of FIG. 11A. Then, the gate oxide film 104 is formed in element regions by means of the thermal oxidation or the CVD method and non-doped polysilicon or N-type polysilicon 105B is piled up on the gate oxide film 104. When non-doped polysilicon is piled up by means of the CVD method, the polysilicon is doped with an N-type impurity by means of a thermal diffusion method or a combined method of ion implantation and thermal diffusion to produce N-type in the polysilicon.

Figure 12A:
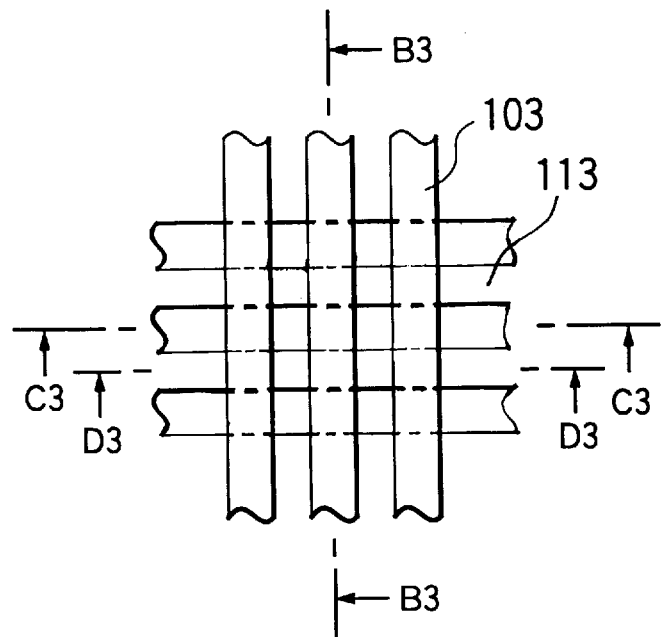
FIG. 12A is a plan view illustrating a second step of the method as that of FIG. 11A, and FIGS. 12B, 12C and 12D are respective sectional views of FIG. 12A taken on lines B3—B3, C3—C3 and D3—D3.
Figure 12B:
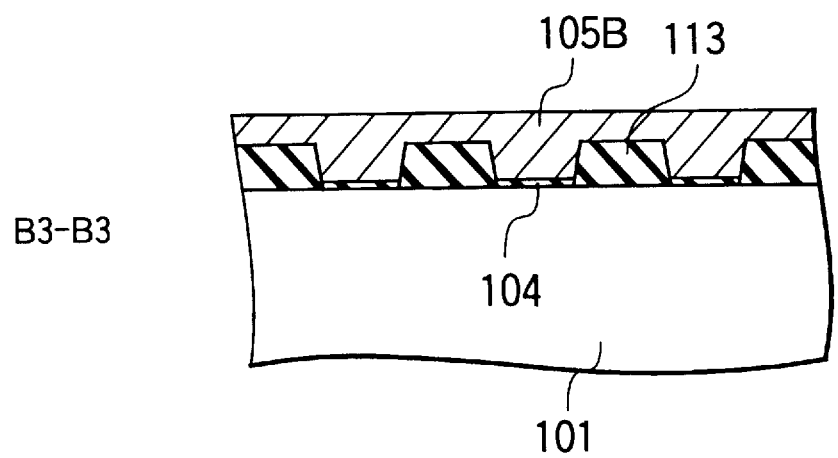
Figure 12C:
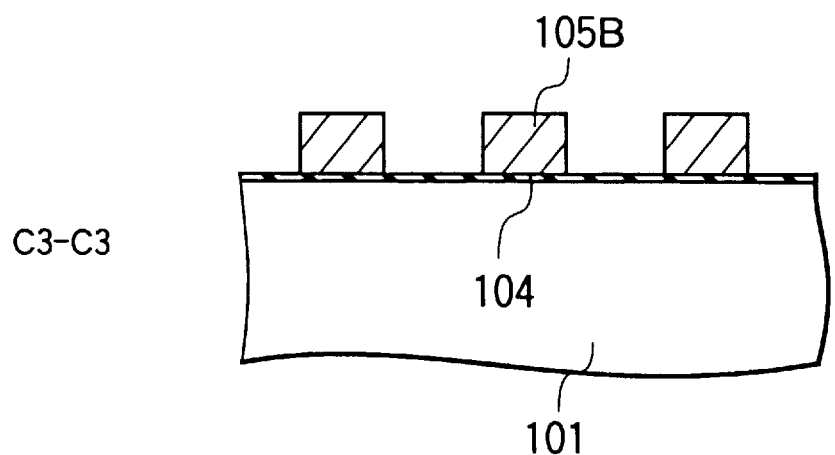
Figure 12D:
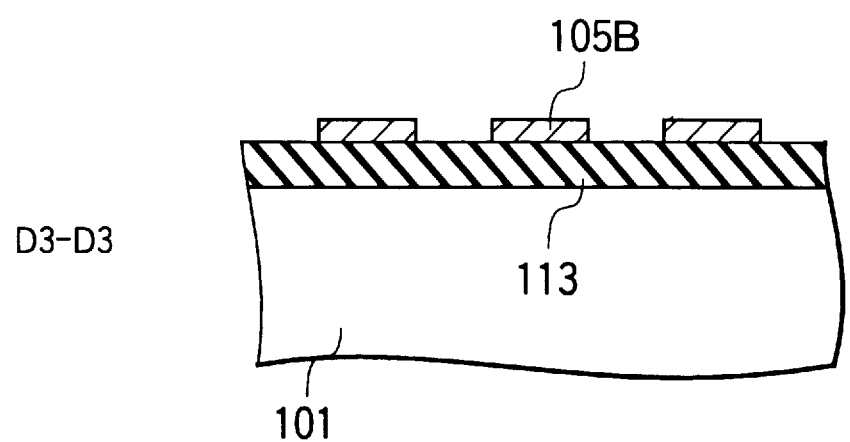

The polysilicon 105B is patterned in the form of lines, as shown in FIG. 12A. FIGS. 12B, 12C and 12D are respective sectional views taken on lines B3—B3, C3—C3 and D3—D3. Sectional views of FIGS. 12B to 12D are indicated with respective marks corresponding to regions or portions.

Figure 13A:
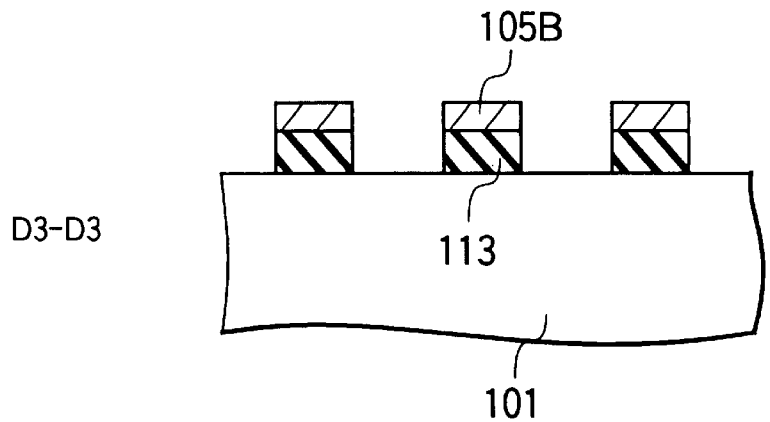
FIGS. 13A to 13I are respective sectional views showing a third to 11th steps of the method of a semiconductor memory device of the second embodiment of the present invention.

As shown in FIG. 13A, the oxide film 113 for isolation between strips of the patterned polysilicon 105B is removed by, for example, a dry etching method while the patterned polysilicon 105B is used as mask.

Figure 13B:
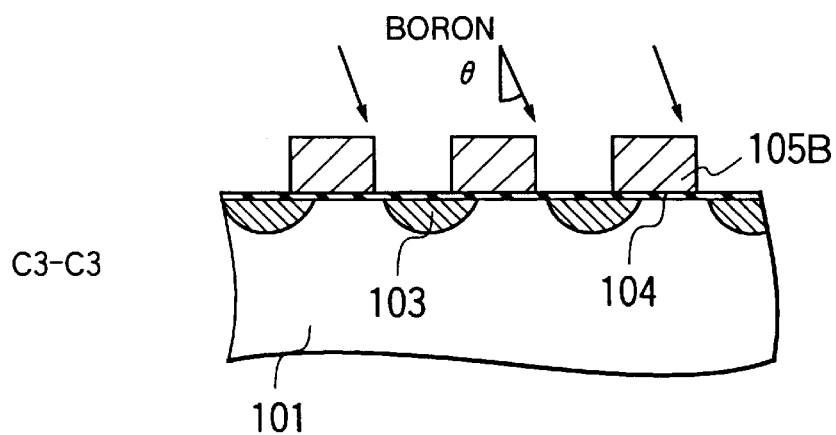

In FIG. 13B, a P-type impurity, for example boron, is ion-implanted obliquely at an angle ($0°<\theta<90°$) relative to the surface of the substrate to form the P-type diffused layer 103. In this situation, the P-type diffused region 103 overlaps one end of the polysilicon 105B and a region where the ion-implantation is not effected by a shadowing effect of the adjoining polysilicon 105B is left at the other end of the polysilicon 105B.

Figure 13C:
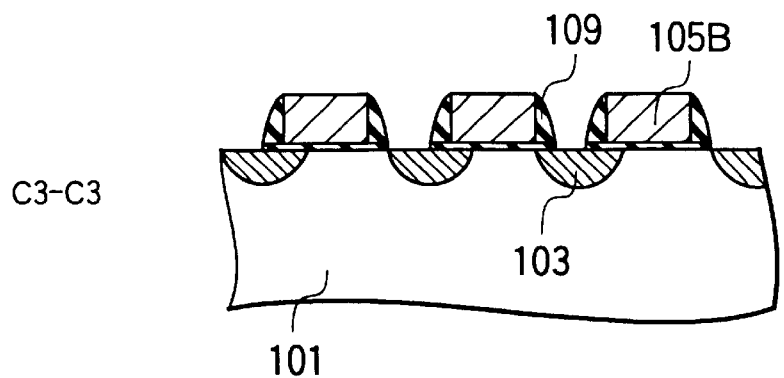

As shown in FIG. 13C, an oxide film is piled up by means of the CVD method, the oxide film is etched back to form oxide side walls 109.

Figure 13D:
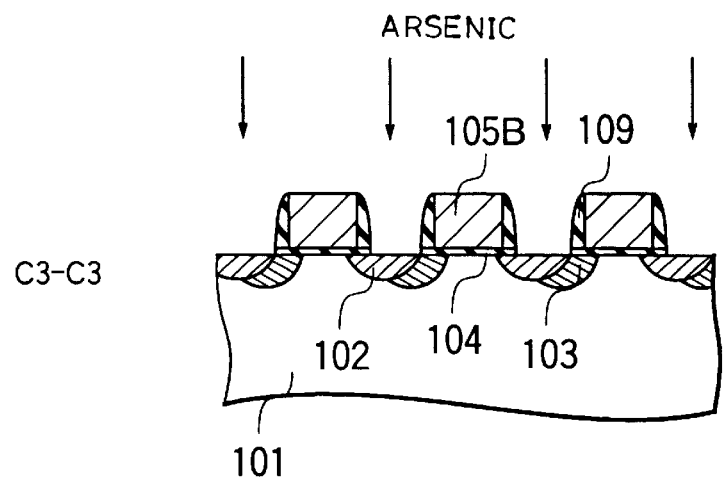

Next, as shown in FIG. 13D, ion-implantation of an N-type impurity, for example arsenic, is performed in a direction normal to the surface of a substrate or at an angle relative thereto inclined in an opposed direction to that of when the P-type diffusion layer 103 is created by ion-implantation to form the N-type diffused layers 102. In this situation, an offset region is created between an N-type diffused layer and one end of polysilicon 105B, which is overlapped by the boron diffused layer 102, since boron is sufficiently high in concentration at the one end of polysilicon 105B, even under an influence of arsenic diffusion which occurs. However, in a region at the other end of polysilicon 105B, which is not ion-implanted with boron, arsenic is diffused to form the N-type diffused layer 102 and the N-type diffused layer overlaps the polysilicon 105B.

Figure 13E:
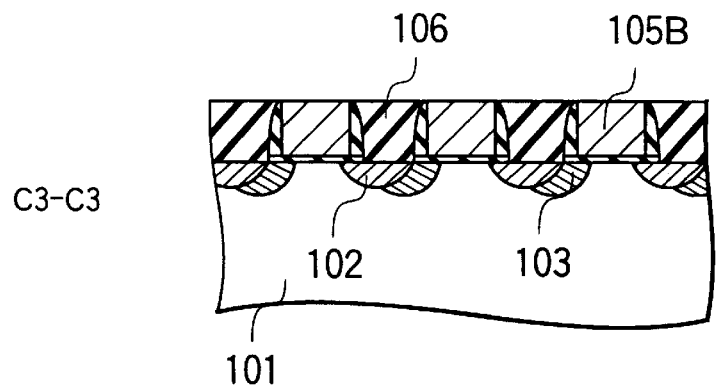

Then, as shown in FIG. 13E, a dielectric film 106, for example an oxide film, is piled up by means of the CVD method and the oxide film 106 is etched back to bury spaces between polysilicon therewith, wherein the upper surface of the polysilicon 105B is fully exposed in the etching back.

Figure 13F:
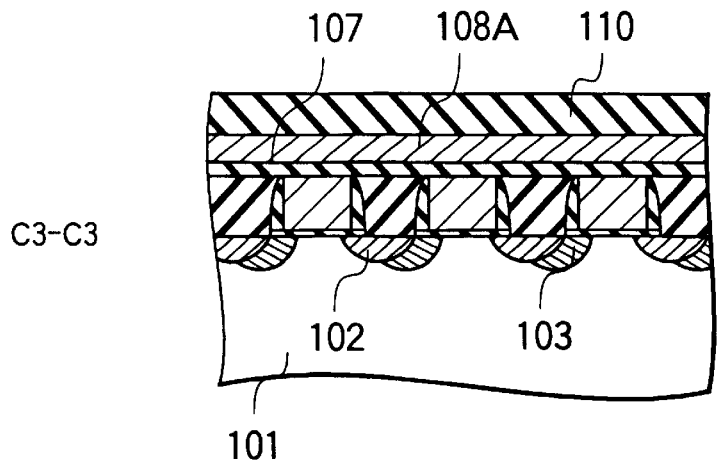

An dielectric film 107, for example an oxide film or a layered structure of an oxide film and a nitride film, is formed on the exposed polysilicon 105B, as shown in FIG. 13F, a polysilicon or polycide film 108A is piled up on the dielectric film 107 and further, a dielectric film 110, for example an oxide film, is formed by means of the CVD or thermal oxidation method on the polysilicon or polycide film 108A.

Figure 13G:
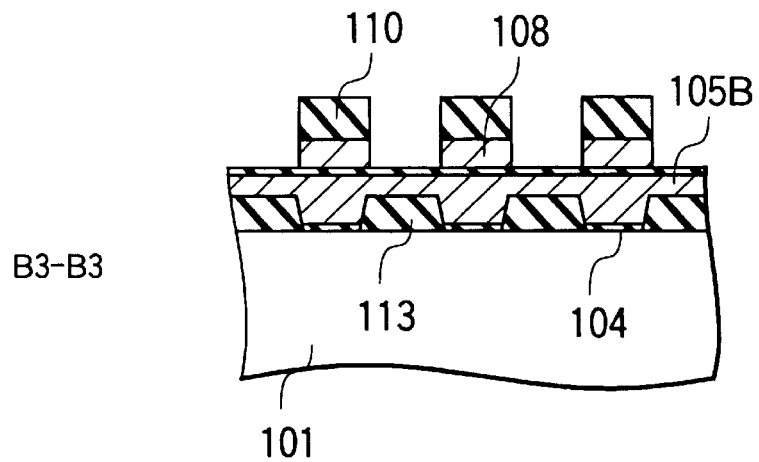

The oxide film 110 and the polysilicon or polycide film 108A are processed in pattern configuration to form control gates 108, as shown in FIG. 13G.

Figure 13H:
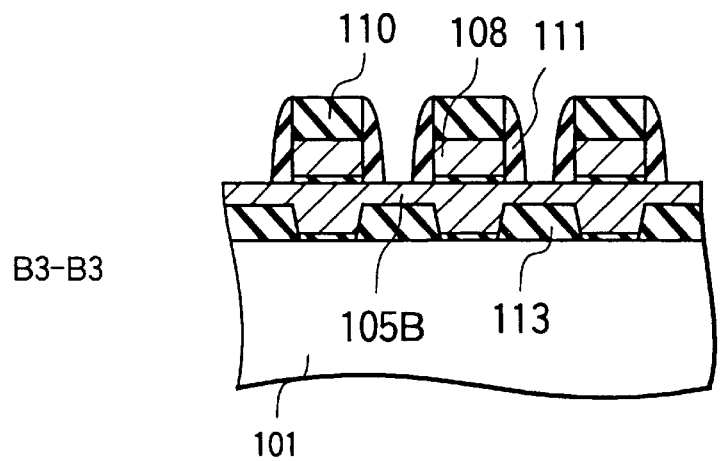

As shown in FIG. 13H, a dielectric film, for example an oxide film, is piled up, after the processing in pattern configuration, by means of the CVD method and the dielectric film is etched back by dry etching to form oxide side walls 111.

Figure 13I:
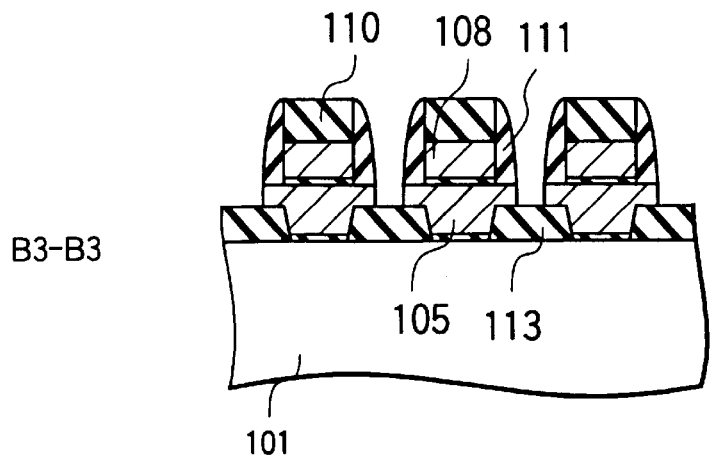

The polysilicon 105B is removed for isolation by dry etching using the oxide film 110 and the oxide film side walls 111 as mask, as shown in FIG. 13I, to form the floating gates 105.

As shown FIG. 10C, a dielectric film 114, for example an oxide film, is formed to cover exposed portions of the floating gates 108 by means of the CVD or thermal oxidation method. Polysilicon is further piled up on the dielectric film 114 by means of the CVD method and the polysilicon is patterned to form erase electrodes 112, so that memory cells are completed. The above mentioned oxide film 114 between the floating gate 105 and the erase electrode 112 is a tunnel dielectric film.

Figure 14A:
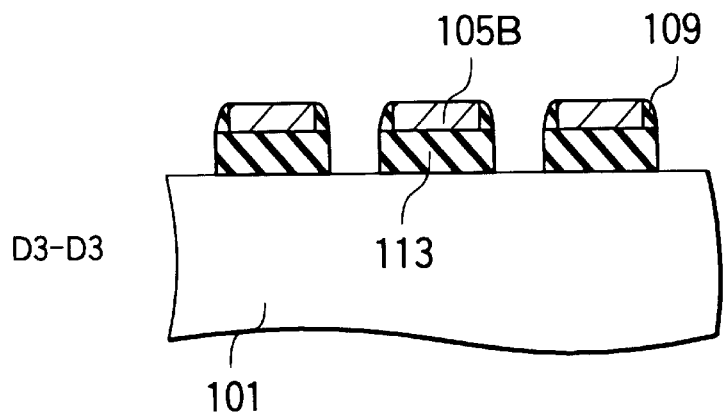
FIGS. 14A to 14C are respective sectional views illustrating a method of a semiconductor memory device of a third embodiment of the present invention in the processing order thereof.
Figure 14B:
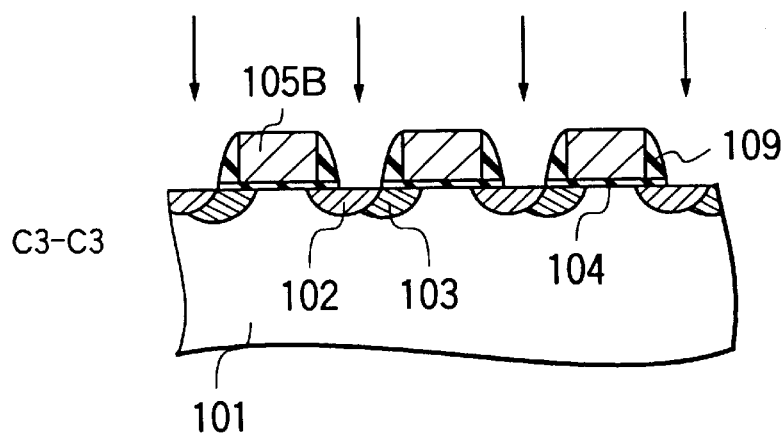
Figure 14C:
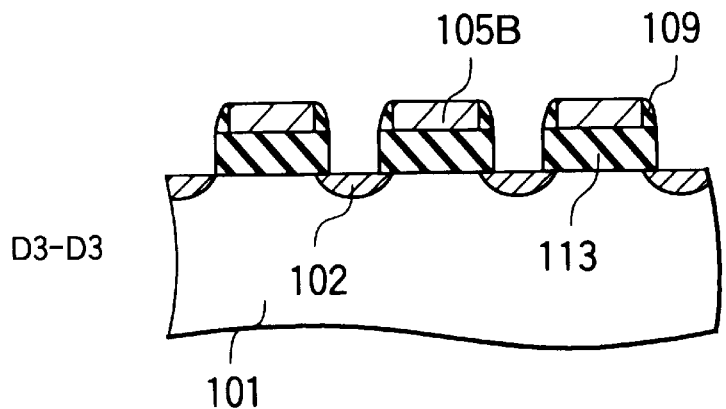

Next, a third embodiment of the present invention will, in depth, be described in reference to FIGS. 14A to 14C. As shown in the process depicted in FIGS. 10A to 10C, 11A to 11B, 12A to 12D and 13A to 13I of the second embodiment, the process adopted by the second embodiment includes the following steps of; forming an oxide film 113 for isolation of elements on a P-type semiconductor silicon substrate 101; also forming a gate oxide film 104 and polysilicon 105A on the substrate 101 or a previous film already formed; ion-implanting a P-type impurity obliquely to the substrate 101, for example at an angle θ relative to the surface (0°<θ<90°), to create a P-type diffused layer 103; and finally forming oxide side walls 109, which are the same as those of the second embodiment.

However, in the third embodiment, when oxide side walls 109 are formed, a oxide film 113 for isolation of elements formed in spaces between polysilicons 105B is also removed by a dry etching method, as shown in FIG. 14A.

After the above mentioned steps, as shown in FIGS. 14B and 14C, an N-type impurity, for example arsenic, is ion-implanted to the surface of the substrate 101 in a direction normal to the surface of the substrate 101 or at an angle inclined in an opposed direction to that of when a P-type diffused layer 103 is created by ion-implantation with boron to form an N-type diffused layer 102. In this situation, an offset region is created between an N-type diffused layer 102 and one end of polysilicon 105B, which overlaps the P-type diffused layer 102, since a concentration of boron is sufficiently higher even under diffusion of arsenic which occurs at the one end of polysilicon 105B. On the other hand, an N-type diffused layer 102 overlaps polysilicon 105B at the other end thereof, since an area at the other end of polysilicon 105B is not ion-implanted with boron. The following steps are the same as those of the second embodiment.

Figure 15:
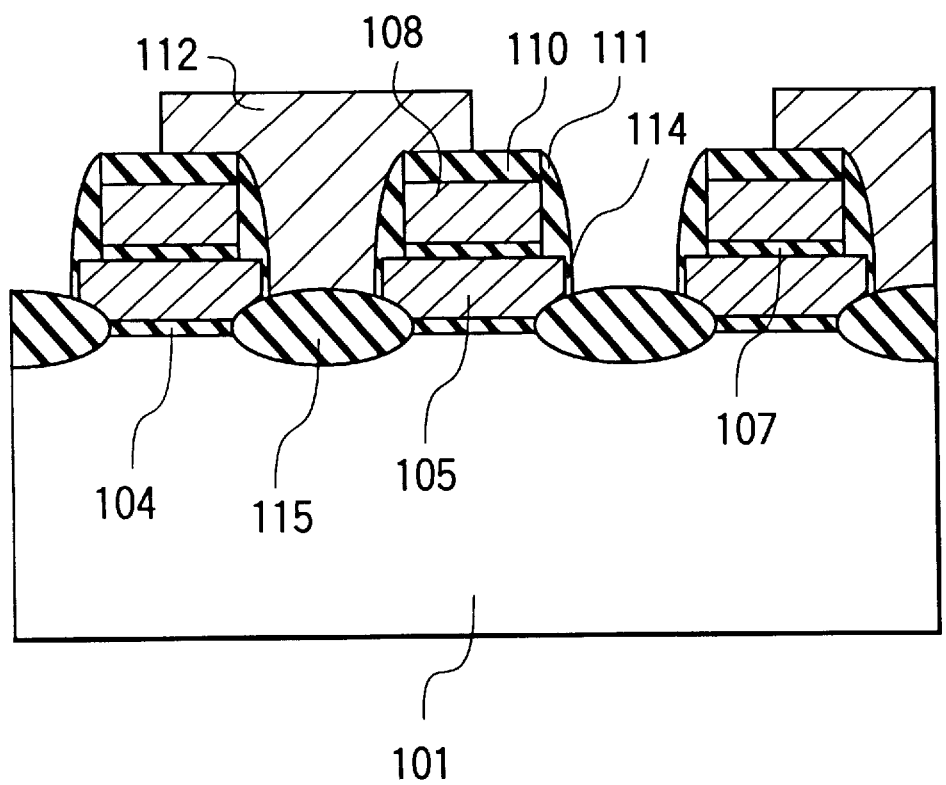
FIG. 15 is a sectional view showing a semiconductor memory device of a fourth embodiment of the present invention.

Next, a fourth embodiment of the present invention will be described. FIG. 15 is a sectional view showing a semiconductor memory device of the fourth embodiment of the present invention. An isolation technique using LOCOS isolation or modified LOCOS isolation structure 115 is adopted in the fourth embodiment instead of the isolation techniques of the second and third embodiments. When such isolation techniques are used, about half the thickness of an oxide film for isolation is formed under the surface of the substrate, which reduces the height of memory cells. It is important to reduce the height of a memory cell in order to progress miniaturization of elements packed in a chip, since a three dimensional structure with emphasized peaks and valleys is basically unfavorable to fine processing. A method adopted in the fourth embodiment is only different from the manufacturing methods adopted in the second and third embodiments in that LOCOS isolation structure is adopted as isolation in the fourth embodiment.

Figure 16:
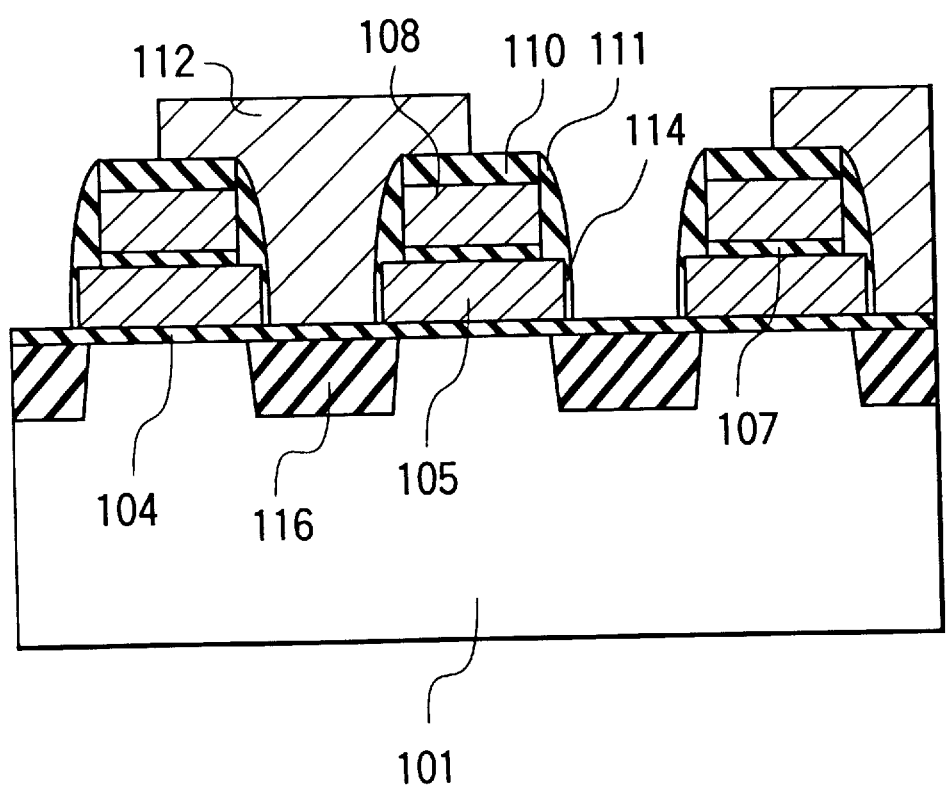
FIG. 16 is a sectional view showing a semiconductor memory device of a fifth embodiment of the present invention.

Next, a fifth embodiment of the present invention will be described in reference to FIG. 16. In FIG. 16, a trench isolation structure 116 is adopted as an isolation technique instead of the isolation techniques of the second and third embodiments of the present invention. When this isolation technique is used, the height of a memory cell is reduced more than the case of the fourth embodiment of the present invention, which makes fine processing easier.

A method adopted in the fifth embodiment is only required to adopt, instead of the steps of the second and third embodiments for forming an isolation structure, the following steps of; forming trenches in the silicon substrate; piling up a dielectric film, for example an oxide film, by means of a CVD method; and etching back the oxide film by means of dry etching to bury the trenches with the oxide film.

In the above descriptions covering the embodiments, a memory cell of N-channel type, as an example, is used. It is to be understood, however, that the present invention is not restricted to cases employing a memory cell of N-channel type, but similar structures of P-channel type to those of the memory cells of N-channel type and a method of manufacturing the same, provided that proper types of impurities are selected, should be included within the scope of the present invention as defined in the appended claims.

What is claimed is:

1. A non-volatile semiconductor memory device having a contactless array structure, said device comprising:

a plurality of bit-lines;

a plurality of word-lines, each word-line of said plurality of word-lines overlapping said plurality of bit-lines;

a plurality of floating gates, each floating gate of said plurality of floating gates located elevationally between a respective bit-line of said plurality of bit-lines and an overlapping respective word-line of said plurality of word-lines; and a plurality of offset regions, each offset region of said plurality of offset regions being adjacent and extending parallel to a respective bit-line of said plurality of bit-lines, said each floating gate partially overlapping a respective offset region of said plurality of offset regions, each offset region of said plurality of offset regions having a higher resistance than the adjacent respective channel region.

2. The non-volatile semiconductor memory device according to claim 1, where in s aid plurality of word-lines overlap said plurality of offset regions, and further comprising a dielectric film isolating said offset regions from said plurality of word-lines.

3. The non-volatile semiconductor memory device according to claim 2, further comprising a plurality of erase electrodes between every second and every third word-line of said plurality of word-lines.

4. The non-volatile semiconductor memory device according to claim 3, further comprising a plurality of LOCOS dielectric films, each LOCOS dielectric film of said plurality of LOCOS dielectric films adjoining adjacent ones of said plurality of floating gates.

5. The non-volatile semiconductor memory device according to claim 3, further comprising a plurality of trenches in a substrate, each trench of said plurality of trenches located between adjacent ones of said plurality of floating gates; and a dielectric film filling said plurality of trenches.

6. A method of manufacturing a non-volatile semiconductor memory device, comprising the steps of:

forming a gate dielectric film on a semiconductor substrate of first conductivity type;

forming a floating gate electrode on the gate dielectric film;

forming an offset region by ion-implanting a first impurity of the first conductivity type into the semiconductor substrate obliquely to a surface thereof so that a region of the substrate adjacent one side of the floating gate electrode is shadowed by the floating gate electrode;

forming dielectric side walls on sides of the electrode;

forming bit-lines by ion-implanting a second impurity of second conductivity type into the substrate in a direction that is one of normal to the surface thereof and at an angle relative to the surface thereof inclined in a direction opposed to that of the step of forming the offset region; and forming word-lines overlapping the bit-lines.

7. The method of manufacturing a non-volatile semiconductor device according to claim 6, further comprising the initial steps of:

forming a thick dielectric film on the semiconductor substrate;

removing the thick dielectric film in element regions; and forming the gate dielectric film in the element regions.

8. The method of manufacturing a non-volatile semiconductor device according to claim 6, further comprising the steps of:

forming tunnel dielectric films on sides of the word-lines; and forming an erase electrode between the tunnel dielectric films of adjacent word-lines.

* * * * *